(12) United States Patent  
Huang et al.

(10) Patent No.: US 8,912,608 B2
(45) Date of Patent: Dec. 16, 2014

(54) SEMICONDUCTOR DEVICE AND FABRICATION METHOD THEREOF

(75) Inventors: Yu-Lien Huang, Jhubei (TW); Chun-Fu Cheng, Changhua (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 63 days.

(21) Appl. No.: 13/588,060

(22) Filed: Aug. 17, 2012

(65) Prior Publication Data

US 2014/0048855 A1 Feb. 20, 2014

(51) Int. Cl.
*H01L 27/088* (2006.01)

(52) U.S. Cl.
USPC .......................................................... 257/401

(58) Field of Classification Search
None
See application file for complete search history.

(56) References Cited

U.S. PATENT DOCUMENTS

2010/0129971 A1* 5/2010 Ohta et al. ..................... 438/230
2010/0301394 A1* 12/2010 Shimamune et al. ......... 257/192

* cited by examiner

*Primary Examiner* — Whitney T Moore
*Assistant Examiner* — Joseph Galvin, III
(74) *Attorney, Agent, or Firm* — Haynes and Boone, LLP

(57) ABSTRACT

A semiconductor device and a method for fabricating the semiconductor device are disclosed. A gate stack is formed over a substrate. A spacer is formed adjoining a sidewall of the gate stack. A recess is formed between the spacer and the substrate. Then, a strained feature is formed in the recess. The disclosed method provides an improved method by providing a space between the spacer and the substrate for forming the strained feature, therefor, to enhance carrier mobility and upgrade the device performance.

20 Claims, 6 Drawing Sheets

SEMICONDUCTOR DEVICE AND FABRICATION METHOD THEREOF

FIELD

The disclosure relates to integrated circuit fabrication and, more particularly, to a semiconductor device with a strained structure.

BACKGROUND

When a semiconductor device, such as a metal-oxide-semiconductor field-effect transistor (MOSFET), is scaled down through various technology nodes, high-k gate dielectric layers and metal gate electrode layers are incorporated into the gate stack of the MOSFET to improve device performance with the decreased feature sizes. In addition, strained structures in source and drain (S/D) recess cavities of the MOSFET utilizing selectively grown silicon germanium (SiGe) may be used to enhance carrier mobility.

However, there are challenges to implement such features and processes in complementary metal-oxide-semiconductor (CMOS) fabrication. As the gate length and spacing between devices decrease, these problems are exacerbated. For example, it is difficult to achieve enhanced carrier mobility for a semiconductor device, because strained materials cannot deliver a given amount of strain into the channel region of the semiconductor device, thereby increasing the likelihood of device instability and/or device failure.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the relative dimensions of the various features may be arbitrarily increased or reduced for clarity of discussion.

DESCRIPTION

Figure 1:
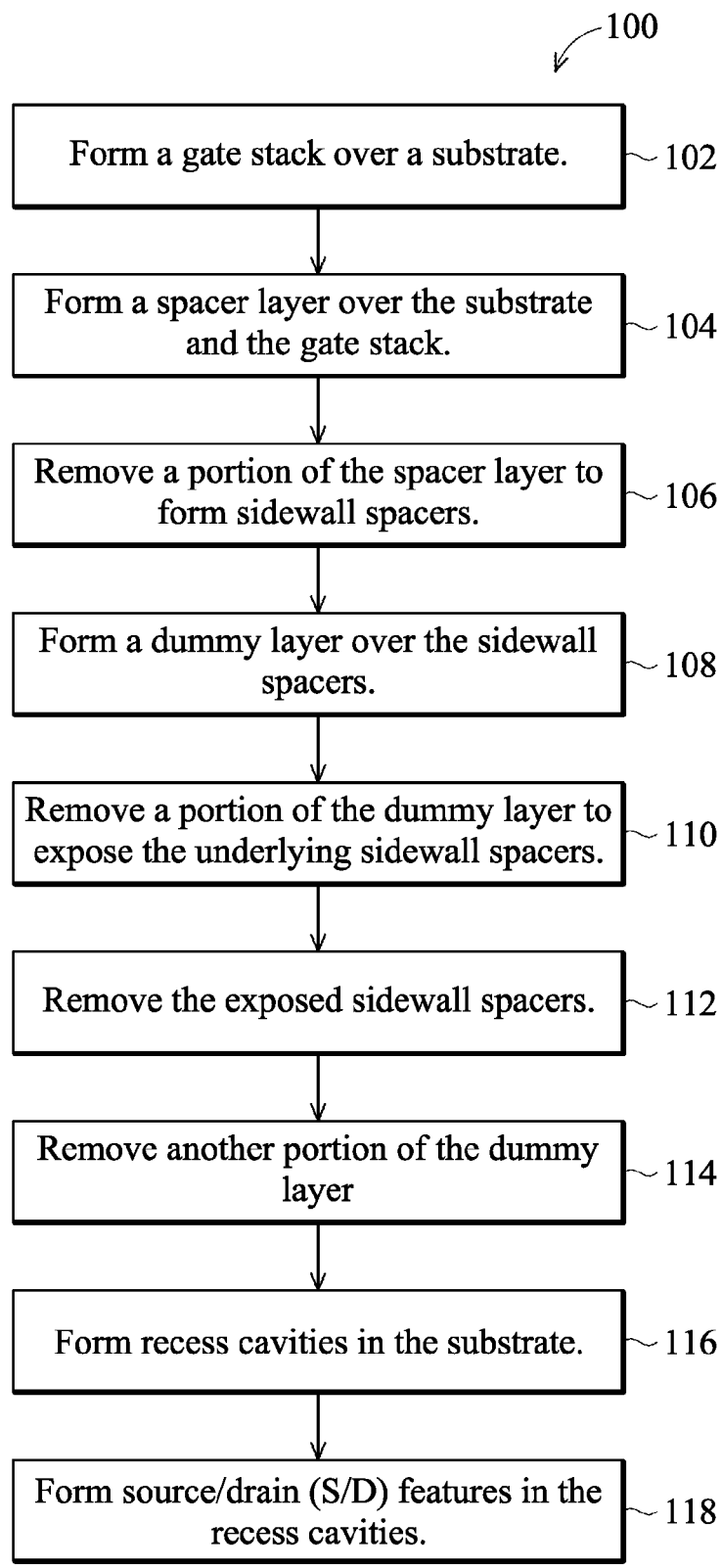
FIG. 1 is a flowchart illustrating a method for fabricating a semiconductor device comprising a strained structure according to various aspects of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flowchart illustrating a method 100 for fabricating a semiconductor device 200 according to various aspects of the present disclosure. FIGS. 2-10 show schematic cross-sectional views of a semiconductor device 200 at various stages of fabrication according to an embodiment of the method 100 of FIG. 1. The semiconductor device 200 may be included in a microprocessor, memory cell, and/or other integrated circuit (IC). It is noted that the method of FIG. 1 does not produce a completed semiconductor device 200. A completed semiconductor device 200 may be fabricated using complementary metal-oxide-semiconductor (CMOS) technology processing. Accordingly, it is understood that additional processes may be provided before, during, and after the method 100 of FIG. 1, and that some other processes may only be briefly described herein. Also, FIGS. 1 through 10 are simplified for a better understanding of the present disclosure. For example, although the figures illustrate the semiconductor device 200, it is understood the IC may comprise a number of other devices comprising resistors, capacitors, inductors, fuses, etc.

Figure 2:
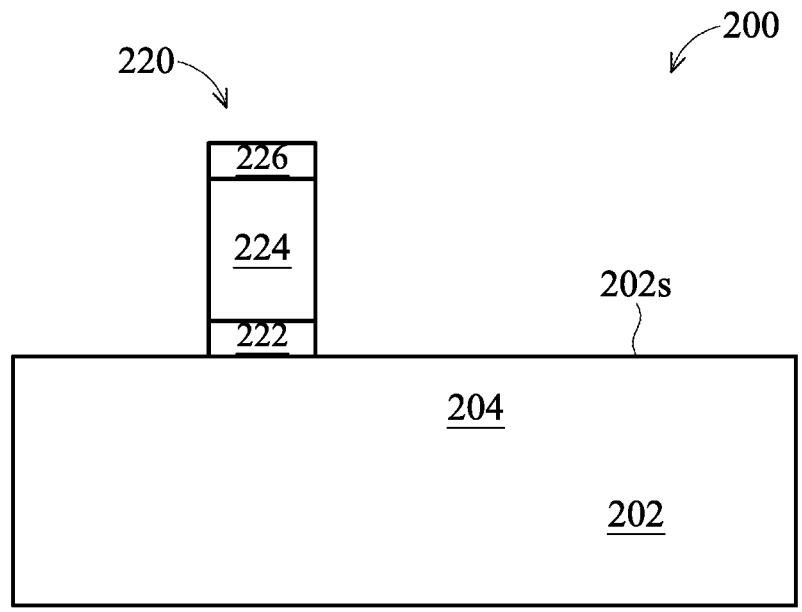
FIGS. 2-10 show schematic cross-sectional views of a strained structure of a semiconductor device at various stages of fabrication according to various aspects of the present disclosure.

Referring to FIGS. 1 and 2, the method 100 begins at step 102 wherein a gate stack 220 is formed over a substrate 202. The substrate 202 includes a top surface 202s. In one embodiment, the substrate 202 comprises a crystalline silicon substrate (e.g., Si wafer). In the present embodiment, the substrate 202 is referred to as a (100) substrate having the top surface 202s formed of the (100) crystal plane. In an alternative embodiment, the substrate 202 may include a silicon-on-insulator (SOI) structure.

In some embodiments, the substrate 202 further comprises active regions 204. The active regions 204 may include various doping configurations depending on design requirements. In some embodiments, the active regions 204 may be doped with p-type or n-type dopants. For example, the active regions 204 may be doped with p-type dopants, using a chemical such as boron or $BF_2$ to perform the doping; n-type dopants, using a chemical such as phosphorus or arsenic to perform the doping; and/or combinations thereof. The active regions 204 may act as regions configured for an N-type metal-oxide-semiconductor transistor device (referred to as an NMOS) and regions configured for a P-type metal-oxide-semiconductor transistor device (referred to as a PMOS).

An isolation structure (not shown) may be formed in the substrate 202 to isolate the various active regions 204. In some embodiments, the isolation structure has edges intersecting with the top surface 202s of the substrate 202. The isolation structure, for example, is formed using isolation technology, such as local oxidation of silicon (LOCOS) or shallow trench isolation (STI), to define and electrically isolate the various active regions 204. In the present embodiment, the isolation structure includes a STI. The isolation structure may comprise silicon oxide, silicon nitride, silicon oxynitride, fluoride-doped silicate glass (FSG), a low-K dielectric material, other suitable materials, and/or combinations thereof. The isolation structure, and in the present embodiment, the STI, may be formed by any suitable process. As one example, the formation of the STI may include patterning the semiconductor substrate 202 by a photolithography process, etching a trench in the substrate 202 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

Still referring to FIG. 2, in some embodiments, the gate stack 220 is formed by sequentially depositing and patterning a gate dielectric layer 222, a gate electrode layer 224, and a hard mask layer 226 on the substrate 202. In some embodiments, the gate dielectric layer 222 and the gate electrode layer 224 have a combined height H1. The gate dielectric layer 222, in one example, is a thin film comprising silicon oxide, silicon nitride, silicon oxynitride, high-k dielectrics, other suitable dielectric materials, or combinations thereof. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the gate dielectric layer 222 is a high-k dielectric layer with a thickness in the range of about 10 angstroms to about 30 angstroms. The gate dielectric layer 222 may be formed using a suitable process such as atomic layer deposition (ALD), chemical vapor deposition (CVD), physical vapor deposition (PVD), thermal oxidation, UV-ozone oxidation, or combinations thereof. The gate dielectric layer 222 may further comprise an interfacial layer (not shown) to reduce damage between the gate dielectric layer 222 and substrate 202. The interfacial layer may comprise silicon oxide.

The gate electrode layer 224 is then formed on the gate dielectric layer 222. In some embodiments, the gate electrode layer 224 includes a single layer or multilayer structure. In the present embodiment, the gate electrode layer 224 comprises polysilicon. Further, the gate electrode layer 224 may be doped polysilicon with the same or different doping species. In one embodiment, the gate electrode layer 224 has a thickness in the range of about 30 nm to about 60 nm. The gate electrode layer 224 may be formed using a process such as low-pressure chemical vapor deposition (LPCVD), plasma enhanced chemical vapor deposition (PECVD), other suitable processes, or combinations thereof.

Next, the hard mask layer 226 is formed over the gate electrode layer 224 and a patterned photo-sensitive layer (not shown) is formed on the hard mask layer 226. The pattern of the photo-sensitive layer is transferred to the hard mask layer 226 and then transferred to the gate electrode layer 224 and the gate dielectric layer 222 to form the gate stack 220 over the top surface 202s of the substrate 202. In some embodiments, the hard mask layer 226 includes silicon oxide. In alternative embodiments, the hard mask layer 226 includes silicon nitride, silicon oxynitride, and/or other suitable dielectric materials, and may be formed using a method such as CVD or PVD. The hard mask layer 226 has a thickness in the range from about 100 angstroms to about 1200 angstroms. The photo-sensitive layer is removed thereafter by a dry and/or wet stripping process.

Figure 3:
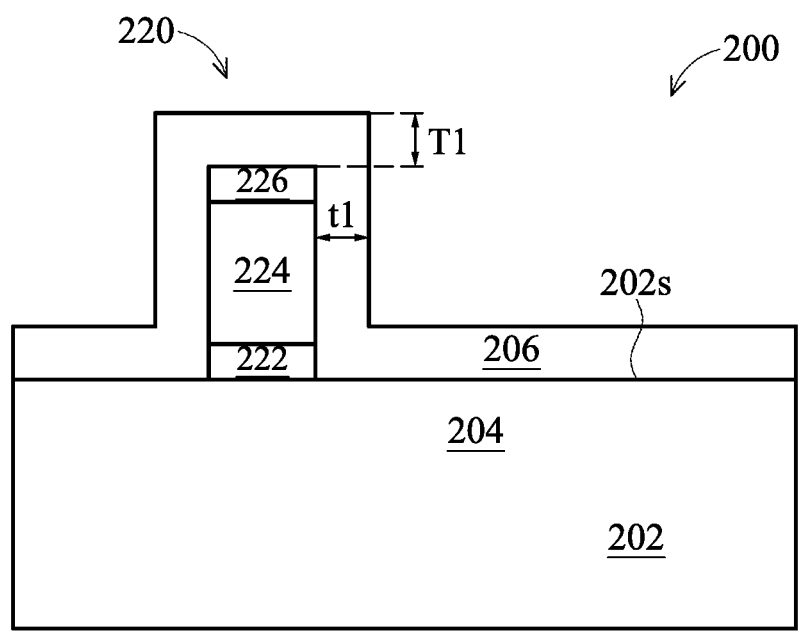

Referring to FIGS. 1 and 3, the method 100 proceeds to step 104 wherein a spacer layer 206 is formed over the substrate 202 and the gate stack 220. The spacer layer 206 has a top portion over a top surface of the gate stack 220, a sidewall portion adjoining a sidewall of the gate stack 220, and a bottom portion over the substrate 202. The top portion of the spacer layer 206 has a thickness T1 and the sidewall portion of the spacer layer 206 has a thickness t1. In some embodiments, the spacer layer 206 is a conformal layer with a ratio of t1/T1 ranging from about 70% to about 100%. In some embodiments, the thickness T1 of the spacer layer 206 ranges from about 70 angstroms to about 250 angstroms. In some embodiments, the spacer layer 206 is a single-layer structure. In alternative embodiments, the spacer layer 206 includes a multiple-layer structure. In some embodiments, the spacer layer 206 is formed of a material, including silicon nitride, SiCN, or combination thereof. In alternative embodiments, the spacer layer 206 includes silicon oxide, silicon oxynitride, other suitable material, or combinations thereof. In the present embodiment, the spacer layer 206 is formed by a deposition process including CVD, PECVD, PVD, ALD, or other suitable techniques.

Figure 4:
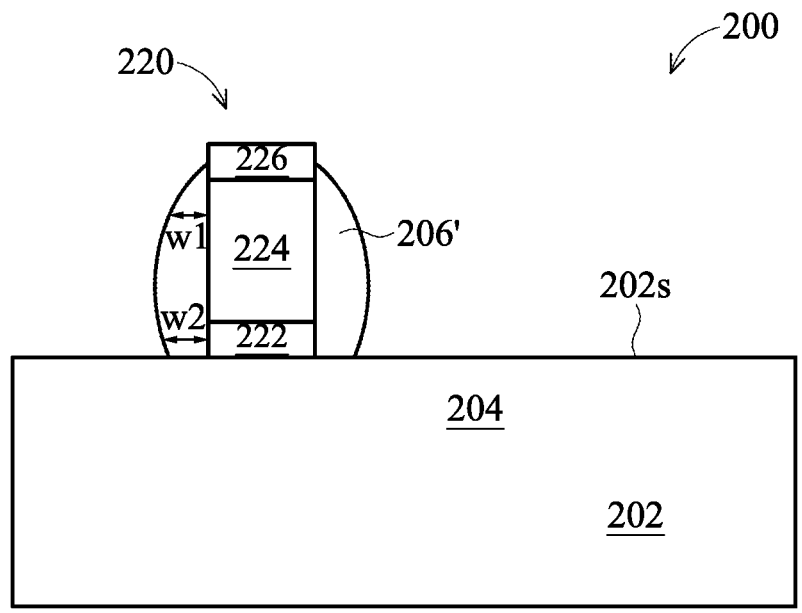

Referring to FIGS. 1 and 4, the method 100 proceeds to step 106 in which at least a portion of the spacer layer 206 is removed to form sidewall spacers (referred to as gate spacers) 206'. In some embodiments, the top portion and the bottom portion of the spacer layer 206 are removed, while leaving the sidewall portion of the spacer layer 206 to form the sidewall spacers 206' adjoining opposite sidewalls of the gate stack 220. The sidewall spacers 206' have an upper portion with a first width w1 and a lower portion with a second width w2 as illustrating in FIG. 4. In some embodiments, the first width w1 is greater than about 3 nm to prevent an epitaxy feature from being formed at top of the gate electrode layer 224 in a subsequent epitaxial growth process. In some embodiments, the first width w1 is less than the second width w2 for forming a designed dummy layer 208 with details explained below. In some embodiments, the removing step includes an anisotropic etching process. In some embodiments, the removing step includes a dry etching process performed using F-containing and/or Cl-containing gas. In alternative embodiments, the removing step includes a wet etching process performed using wet etchant e.g., $H_3PO_4$.

Figure 5:
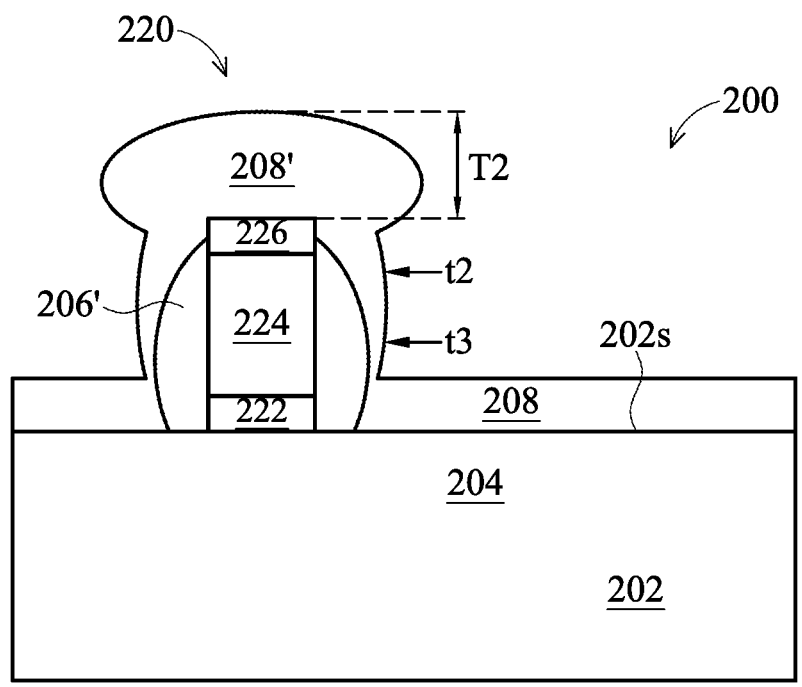

Referring to FIGS. 1 and 5, the method 100 proceeds to step 108 in which the dummy layer 208 is formed over the gate stack 220, the sidewall spacers 206', and the substrate 202. The dummy layer 208 has a top portion over the top surface of the gate stack 220, a sidewall portion adjoining the sidewall spacers 206', and a bottom portion over the substrate 202. The sidewall portion of the dummy layer 208 has an upper portion and a lower portion. The top portion of the dummy layer 208 has a thickness T2, the upper sidewall portion of the dummy layer 208 has a thickness t2, and the lower sidewall portion of the dummy layer 208 has a thickness t3. In some embodiments, the dummy layer 208 is a non-conformal layer and the thickness t3 is less than the thickness t2. In some embodiments, the dummy layer 208 is a non-conformal layer such that the ratio of t3/T2 is less than about 50%. In alternative embodiments, the dummy layer 208 is a non-conformal layer with the ratio of t3/T2 less than about 30%. In some embodiments, a correlation between the thickness T2, the thickness t2, and the thickness t3 of the dummy layer 208 satisfies a formula, T2>t2>t3.

In some embodiments, the dummy layer 208 is a single-layer structure. In alternative embodiments, the dummy layer 208 includes a multiple-layer structure. In some embodiments, the dummy layer 208 includes a C-containing material, e.g., CxHy (x=0~10, y=2~22). In the present embodiment, the dummy layer 208 is formed using a precursor, e.g., $C_3H_8$ and/or $CH_4$, by a deposition process including CVD, PECVD, or plasma doping technique. In the present embodiment, the dummy layer 208 is formed at a temperature ranging from about room temperature (e.g., 23° C.) to about 400° C.

Figure 6:
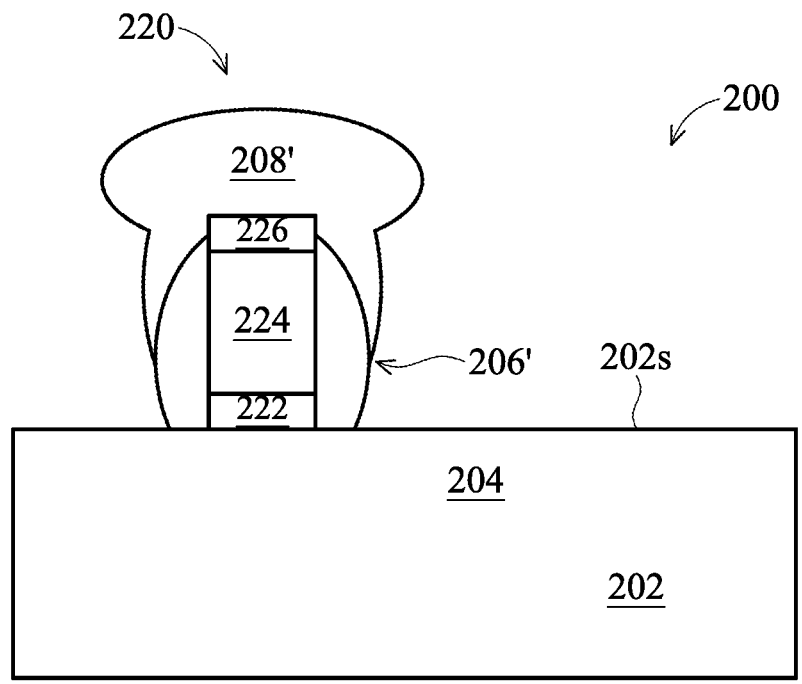

Referring to FIGS. 1 and 6, the method 100 continues with step 110 in which at least a portion of the dummy layer 208 is removed to expose the underlying sidewall spacers 206'. In some embodiments, another portion of the dummy layer 208 is left to form a dummy spacer 208'. In some embodiments, the removing step removes the bottom portion of the dummy layer 208 over the substrate 202 and the lower sidewall portion of the dummy layer 208 adjoining the sidewall spacers 206', while leaving the top portion of the dummy layer 208 over the gate stack 220 and the upper sidewall portion of the dummy layer 208 adjoining the sidewall spacers 206'. In some embodiments, the lower portion of the sidewall spacers 206' is exposed after the step of removing, while the upper portion of the sidewall spacers 206' is covered and protected by the dummy spacer 208'. In some embodiments, the removing step is an isotropic etching process. In some embodiments, the removing step includes a dry etching process, wet etching process, and/or plasma treatment. In some embodiments, the removing step includes a dry etching process using O-containing gas, e.g. $O_2$ gas.

Figure 7:
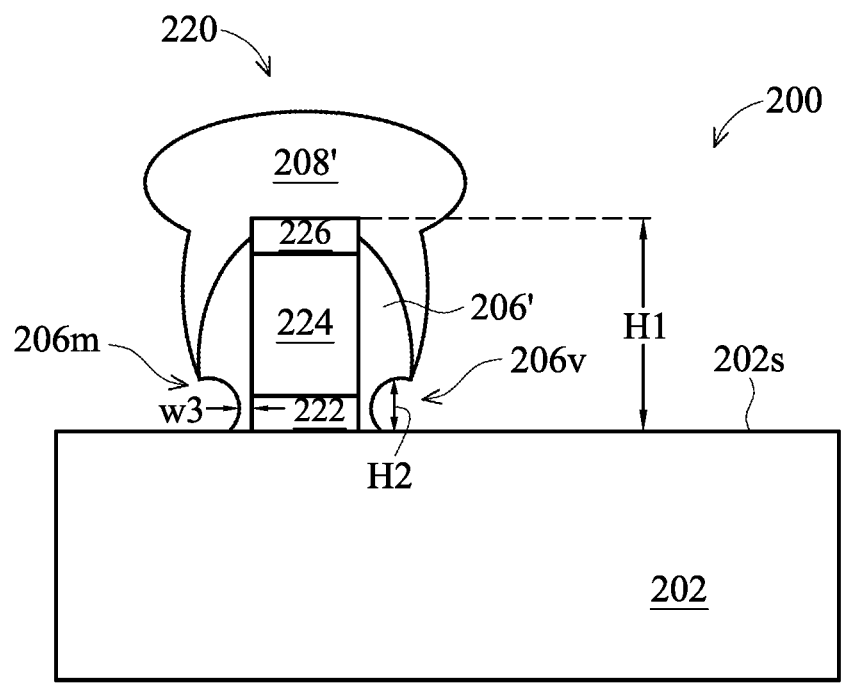

Referring to FIGS. 1 and 7, the method 100 continues with step 112 in which at least a portion of the exposed lower sidewall spacers 206' are removed to form recess cavities 206v. In some embodiments, the upper sidewall spacers 206' are not removed in the removing step because of the protection of the dummy spacer 208'. In some embodiments, recess cavities 206v are vertically located between the upper sidewall spacers 206' and the substrate 202, and leave room under the upper sidewalls spacers 206' with a height H2 measured from the top surface 202s of the substrate 202 to the bottom surface of the upper sidewall spacers 206'. In some embodiments, the height H2 is greater than about 5 nm. In some embodiments, the height H2 satisfies the following formula, $0.9 \geq H2/H1 \geq 0.1$.

In some embodiments, the lower sidewall spacers 206' are partially removed, while leaving a remaining portion 206m at the corner between the gate stack 220 and the substrate 202 without exposing the lower sidewalls of the gate stack 220. The remaining portion 206m has a width w3. In some embodiments, the width w3 is less than about 4 nm to have an epitaxy feature formed in the recess cavities 206v in a subsequent epitaxial growth process. In alternative embodiments, the exposed lower sidewall spacers 206' are completely removed to expose lower sidewalls of the gate stack 220.

In some embodiments, the removing step for forming the recess cavities 206v includes an isotropic etching process. In some embodiments, the removing step includes a dry etching process, wet etching process, and/or plasma treatment. In some embodiments, the removing step is a dry plasma etching process performed using F-containing (e.g. $CF_4$, $CH_2F_2$, $CHF_3$, $CH_3F$, $NF_3$, $SF_6$) and/or Cl-containing gas (e.g. $Cl_2$) selective to the material in the sidewall spacers 206'. In alternative embodiments, the removing step is a wet etching process using e.g., $H_3PO_4$ chemical.

Figure 8:
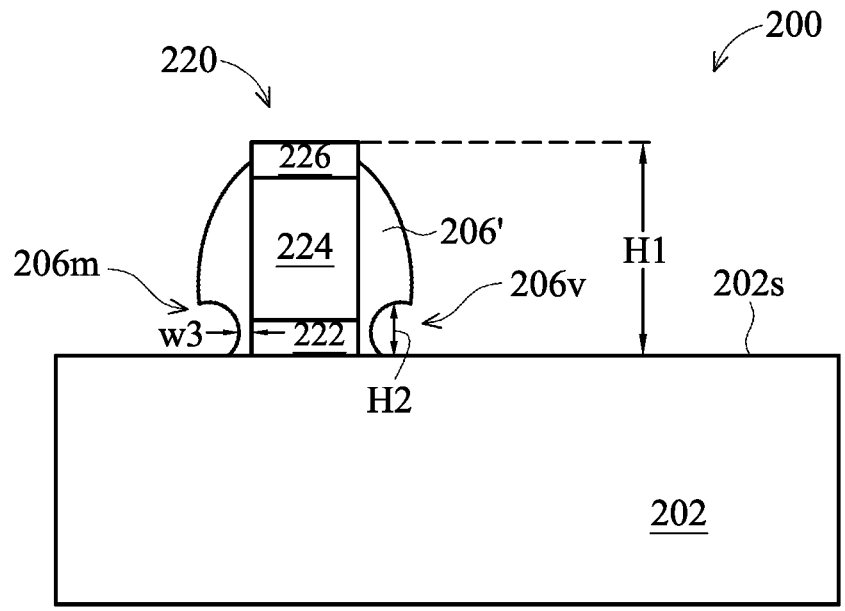

Referring to FIGS. 1 and 8, the method 100 continues with step 114 in which the remaining portion of the dummy layer 208 over the gate stack 220 and adjoining the sidewall spacers 206' are completely removed. In some embodiments, the removing step includes a dry etching process using O-containing gas, e.g. $O_2$ gas, selective to the dummy layer 208.

Figure 9:
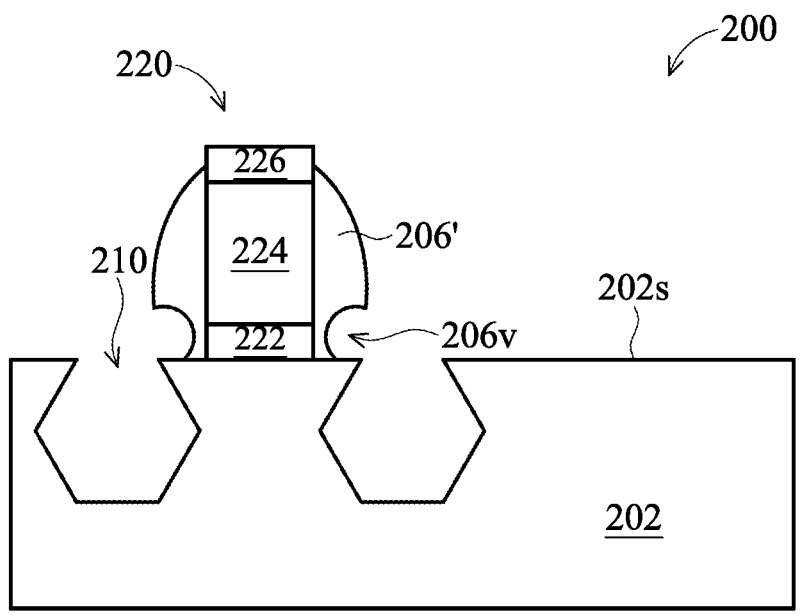

Referring to FIGS. 1 and 9, the method 100 continues with step 116 in which recess cavities 210 are formed in the substrate 202. In some embodiments, the recess cavities 210 are adjacent to opposite edges of the gate stack 220 with a portion below the sidewall spacers 206'. In some embodiments, the recess cavities 210 are source and drain (S/D) recess cavities for the gate stack 220. In the present embodiment, the processes for forming the recess cavities 210 are start by using an anisotropic dry etching process to break through a native oxide (not shown) formed on the top surface 202s of the substrate 202, followed by an isotropic or anisotropic (dry or wet) etching process. In some embodiments, the anisotropic dry etching process is performed using the sidewall spacers 206' as hard masks to recess the substrate 202. The surface 202s of the substrate 202 uncovered by the sidewall spacers 206' are recessed to form initial recess cavities (not shown) in the substrate 202. In an embodiment, the anisotropic dry etching process may be performed under a pressure of about 1 mTorr to about 1000 mTorr, a power of about 50 W to about 1000 W, a bias voltage of about 20 V to about 500 V, at a temperature of about 20° C. to about 80° C., using HBr and/or $Cl_2$ and/or $CF_4$, $CH_2F_2$, $CHF_3$, $CH_3F$, $NF_3$, $SF_6$) as etch gases. Also, in the embodiments provided, the bias voltage used in the isotropic dry etching process may be tuned to allow better control of an etching direction to achieve desired profiles for the S/D recess regions.

In some embodiments, a wet etching process is then provided to enlarge the initial recess cavities to form the recess cavities 210. In some embodiments, the wet etching process is performed using a chemical including hydration tetramethyl ammonium (TMAH), or the like. In some embodiments, the recess cavities 210 are wedge-shaped with tips extend into the substrate 202. In some embodiments, the recess cavities 210 are wedge-shaped with tips in the region right underneath the sidewall spacers 206' toward the channel region under the gate stack 220.

Figure 10:
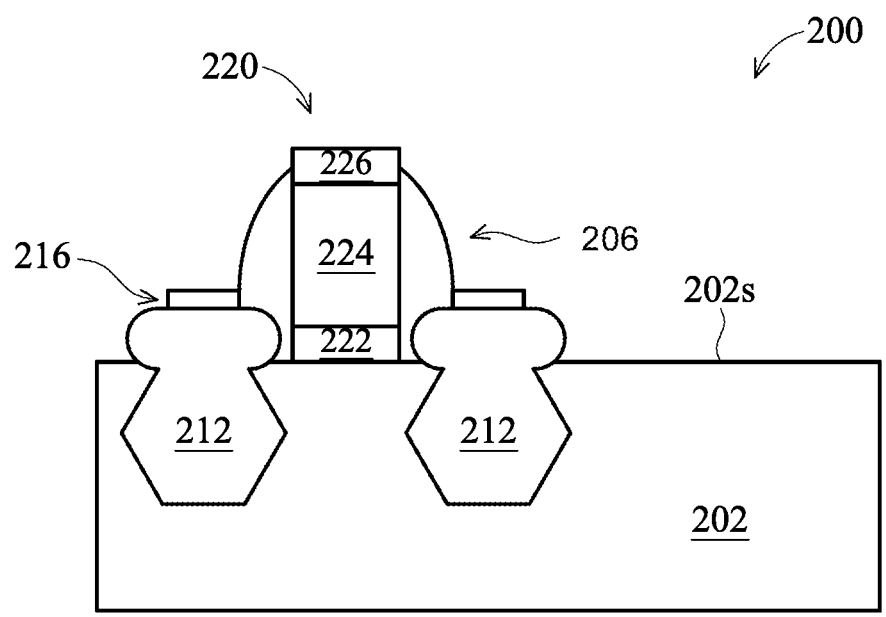

Referring to FIGS. 1 and 10, the method 100 continues with step 118 in which source/drain features 212 are formed in the recess cavities 210 of the substrate 202. In some embodiments, the source/drain features 212 include a strained material and are referred to as strained features. In some embodiments, the source/drain features 212 include a portion below the sidewall spacers 206' and adjacent to a sidewall of the gate stack 220. In some embodiments, the source/drain features 212 are formed in a continuous manner with a first portion positioned vertically between the substrate 202 and the sidewall spacers 206' and a second portion in the substrate 202. In some embodiments, the source/drain features 212 are formed to fill the recess cavities 210 and the recess cavities 206v.

In some embodiments, the source/drain features 212 are grown in the recess cavities 210 and the recess cavities 206v using a process including selective epitaxy growth (SEG), cyclic deposition and etching (CDE), chemical vapor deposition (CVD) techniques (e.g., vapor-phase epitaxy (VPE) and/or ultra-high vacuum CVD (UHV-CVD)), molecular beam epitaxy (MBE), other suitable epi processes, or combinations thereof. In some embodiments, the strained material has a lattice constant different from the substrate 202 to induce a strain or stress on the channel region of the semiconductor device 200, and therefore enable carrier mobility of the device to enhance the device performance. In the present embodiment, the volume of the strained material is increased by providing additional space, the recess cavities 206v, for forming the strained material. Therefore, the strain effect is further increased to enhance the carrier mobility and device performance.

In some embodiments, a pre-cleaning process is performed to clean the recess cavities 210 and/or 206v using a chemical comprising hydrofluoric acid (HF) or other suitable solution. Then, gaseous and/or liquid precursors may be provided to interact with the composition of the substrate 202 to form the strained material, such as silicon germanium (SiGe), to fill the recess cavities 210 and 206v. In one embodiment, the process for forming the strained material comprising SiGe is performed at a temperature of about 600° to 750° C. and under a pressure of about 10 Torr to about 80 Torr, using reaction gases comprising $SiH_2Cl_2$, HCl, $GeH_4$, $B_2H_6$, $H_2$, or combinations thereof. In some embodiments, a ratio of a mass flow rate of the $SiH_2Cl_2$ to a mass flow rate of the HCl is in the range of about 0.45 to 0.55.

Still referring to FIG. 10, a capping layer 216 is formed over the source/drain features 212. The capping layer 216 may function as a protection layer to prevent the underlying strained material from being over-etched in a subsequent etching process. In the present embodiment, the capping layer 216 is formed by an epi growth process. In some embodiments, the capping layer 216 comprises a material different from the strained material. In some embodiments, the capping layer 216 is a silicon-containing layer formed by a process including selective epitaxy growth (SEG), cyclic deposition and etching (CDE), chemical vapor deposition (CVD) techniques (e.g., vapor-phase epitaxy (VPE) and/or ultra-high vacuum CVD (UHV-CVD)), molecular beam epitaxy (MBE), other suitable epi processes, or combinations thereof. In the present embodiment, the capping layer 216 is formed by a process that is the same as the process for forming the source/drain features 212. The capping layer 216 can be patterned, as shown in the figure, such as by using a growth process on the source/drain features 212, or by a lithography process.

It is understood that the semiconductor device 200 may undergo further CMOS processes to form various features such as contacts/vias, interconnect metal layers, dielectric layers, passivation layers, etc. In some embodiment, the gate stacks may be dummy gate stacks. Thus, the CMOS processes further comprise a "gate last" process to replace the polysilicon gate electrode with a metal gate electrode to improve device performance. In one embodiment, the metal gate electrode may include a metal such as Al, Cu, W, Ti, Ta, TiN, TiAl, TiAlN, TaN, NiSi, CoSi, other suitable conductive materials, or combinations thereof. It has been observed that the modified strained structure provides a given amount of strain into channel region of a semiconductor device, thereby enhancing the device performance.

The various embodiments of the present disclosure discussed above offer advantages over conventional methods, it being understood that no particular advantage is required for all embodiments, and that different embodiments may offer different advantages. One of the advantages is the volume of the strained material may be increased by providing an addition space between the sidewall spacer and the substrate for forming the strained material, therefore, the carrier mobility may be enhanced to upgrade the device performance.

In one embodiment, a semiconductor device includes a gate stack having a gate electrode layer and a gate dielectric layer over a substrate, a spacer adjoining a sidewall of the gate stack, and a first strained feature vertically positioned between the substrate and the spacer.

In another embodiment, a semiconductor device includes a gate stack having a gate electrode layer and a gate dielectric layer over a substrate, a sidewall spacer adjoining a sidewall of the gate stack, and a strained feature adjacent to a sidewall of the gate stack, wherein the strained feature comprises a first portion vertically between the sidewall spacer and the substrate and a second portion in the substrate.

In still another embodiment, a method for fabricating a semiconductor device, includes forming a gate stack over a surface of the substrate, forming a first spacer layer over the gate stack and the substrate, removing a portion of the first spacer layer to form spacers adjoining opposite sidewalls of the gate stack, forming a second spacer layer over the spacers, the gate stack, and the substrate, removing a portion of the second spacer layer adjoining lower portion of the spacers to expose the underlying spacers while leaving another portion of the second spacer material adjoining upper portion of the spacers, removing at least a portion of the exposed spacers to form a first recess cavity below the spacers; forming a second recess cavity in the substrate, and forming an epitaxial (epi) material in the first recess cavity and the second recess cavity.

While the disclosure has described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
   a gate stack having a gate electrode layer and a gate dielectric layer over a substrate;
   a spacer adjoining a sidewall of the gate stack; and
   a first strained feature vertically positioned between the substrate and the spacer, wherein a first portion of the spacer is positioned directly over a portion of the first strained feature and wherein a second portion of the spacer is positioned directly under the portion of the first strained feature, wherein the first portion of the spacer is directly over the second portion of the spacer such that the second portion is closer to the substrate than the first portion.

2. The device of claim 1, further comprising:
   a second strained feature in the substrate.

3. The device of claim 1, wherein the first strained feature has a height greater than about 5 nm.

4. The device of claim 2, wherein the first strained feature and the second strained feature are an integral part formed with the same material.

5. The device of claim 1, wherein the first strained feature comprises a portion directly contacting the sidewall of the gate stack.

6. The device of claim 1, wherein the first strained feature directly contacts the spacer and the substrate.

7. The device of claim 1, wherein the gate electrode layer and the gate dielectric layer has a combined height H1 and the first strained feature has a height H2, a correlation between the combined height H1 and the height H2 satisfies the following formula, $0.9 \geq H2/H1 \geq 0.1$.

8. The device of claim 1, wherein the first strained feature has a lattice constant different from the substrate.

9. The device of claim 1, wherein the spacer comprises a material of silicon nitride, SiCN, or combination thereof.

10. The device of claim 1, wherein the spacer comprises a lower portion horizontally between the first strained feature and the gate stack.

11. A semiconductor device, comprising:
    a gate stack having a gate electrode layer and a gate dielectric layer disposed over a top surface of a substrate;
    a sidewall spacer adjoining a sidewall of the gate stack;
    a strained feature adjacent to the sidewall of the gate stack, wherein the strained feature comprises a first portion vertically between the sidewall spacer and the substrate and a second portion in the substrate, wherein the first portion of the strained feature includes a top surface facing away from the top surface of the substrate; and
    an epitaxial capping layer formed over the strained feature, wherein the epitaxial capping layer comprises a material different than the strained feature, wherein the epitaxial capping layer covers a first area of the top surface of the first portion of the strained feature while a second area of the top surface of the first portion of the strained feature is uncovered by the epitaxial capping layer, wherein the first area of the strained feature is closer to the gate stack than the second area of the strained feature.

12. The device of claim 11, wherein the first portion of the strained feature has a height greater than about 5 nm.

13. The device of claim 11, wherein the gate electrode layer and the gate dielectric layer has a combined height H1 and the first portion of the strained feature has a height H2, a correlation between the combined height H1 and the height H2 satisfies the following formula, $0.9 \geq H2/H1 \geq 0.1$.

14. The device of claim 11, wherein the second portion of the strained feature is a wedged-shape source/drain feature.

15. The device of claim 11, wherein the first portion of the strained feature directly contacts a bottom surface of the sidewall spacer.

16. The device of claim 11, wherein the epitaxial capping layer physically contacts the strained feature.

17. The device of claim 11, wherein a first portion of the sidewall spacer is positioned directly over the first portion of the strained feature and wherein a second portion of the sidewall spacer is positioned directly under the first portion of the strained feature, wherein the first portion of the sidewall spacer is directly over the second portion of the sidewall spacer such that the second portion of the sidewall spacer is closer to the substrate than the first portion of the sidewall spacer.

18. The device of claim 11, wherein the sidewall spacer is formed of a dielectric material, wherein the dielectric material physically contacts a first surface of the first portion that faces the gate stack and a second surface of the first portion that faces away from the substrate such that the same dielectric material physical contacts the first and second surfaces of the first portion.

19. The device of claim 1, further comprising an epitaxial capping layer formed over the first strained feature, wherein the epitaxial capping layer comprises a material different than the first strained feature, wherein the epitaxial capping layer covers a first area of the first strained feature while a second area of the first strained feature is uncovered by the epitaxial capping layer, wherein the first area of the first strained feature is closer to the gate stack than the second area of the first strained feature.

20. The device of claim 19, wherein the epitaxial capping layer physically contacts the first strained feature.

* * * * *